US007003717B2

(12) United States Patent
Kuwazoe et al.

(10) Patent No.: US 7,003,717 B2
(45) Date of Patent: Feb. 21, 2006

(54) DECODING APPARATUS, DECODING METHOD, DATA-RECEIVING APPARATUS AND DATA-RECEIVING METHOD

(75) Inventors: Yasuyoshi Kuwazoe, Chiba (JP); Taku Nagase, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/077,064

(22) Filed: Mar. 10, 2005

(65) Prior Publication Data

US 2005/0157824 A1 Jul. 21, 2005

Related U.S. Application Data

(62) Division of application No. 09/988,957, filed on Nov. 19, 2001, now Pat. No. 6,886,128.

(30) Foreign Application Priority Data

Nov. 17, 2000 (JP) .......................... P2000-351898

(51) Int. Cl.
*H03M 13/00* (2006.01)

(52) U.S. Cl. ...................................................... 714/792

(58) Field of Classification Search ................ 714/792, 714/794, 795

See application file for complete search history.

(56) References Cited

U.S. PATENT DOCUMENTS 6,259,749 B1 * 7/2001 Andoh ....................... 375/341
6,637,004 B1 * 10/2003 Mizuno et al. ............. 714/796

* cited by examiner

*Primary Examiner*—Shelly Chase

(74) *Attorney, Agent, or Firm*—Jay H. Maioli

(57) ABSTRACT

A decoding apparatus, decoding method, data-receiving apparatus, and a data-receiving method for performing a maximum-likelihood decoding process based on a Viterbi algorithm on a data train completing a convolution-encoding process. The apparatus includes a computation device for performing a trellis computation for decoding a data train completing the convolution-encoding process. The decoding apparatus further includes a control device for controlling the trellis computation to be carried out by the computation device with processing timings in processing units each corresponding to a process carried out on n bits of pre-encoding data, in which each of the processing units is parallel processing carried out on computation results obtained for $2^n$ states with one of the processing timings immediately preceding a present one of the processing timings to find the computation results with the present processing timing for the $2^n$ states.

2 Claims, 7 Drawing Sheets

DECODING APPARATUS, DECODING METHOD, DATA-RECEIVING APPARATUS AND DATA-RECEIVING METHOD

This is a division of prior application Ser. No. 09/988,957 filed Nov. 19, 2001 now U.S. Pat. No. 6,886,128.

BACKGROUND OF THE INVENTION

The present invention relates to a decoding apparatus and a decoding method, which are used for decoding data completing a convolution encoding process, as well as relates to a data-receiving apparatus and a data-receiving method, which are used for receiving the decoding data completing the convolution encoding process.

Convolution encoding is one of correction-encoding technologies used in applications such as data communication. Convolution encoding is carried out sequentially.

FIG. 1 is a diagram showing a typical configuration of a convolution encoder having a constraint length of 4. The convolution encoder having a constraint length of 4 includes 3 delay elements (registers) 51, 52 and 53 in addition to a logic circuit 55. The logic circuit 55 carries out typically exclusive logical OR processing on at least some pieces of input data received from an input terminal 50 and of data output by the delay elements 51, 52 and 53. In the typical configuration shown in FIG. 1, the input data from the input terminal 50 and the data output by the delay element 53 are subjected to exclusive logical OR processing in an exclusive logical OR gate 55*a*, which outputs a result of the processing to an output terminal 56*a*. On the other hand, the pieces of data output by the delay elements 51 and 52 are subjected to exclusive logical OR processing in an exclusive logical OR gate 55*b*, which outputs a result of the processing to an output terminal 56*b*. In the typical configuration shown in FIG. 1, the encoding rate is 2 indicating that the convolution encoder has 2 outputs. However, the encoding rate can also be set at 3. In addition, the logic circuit 55 can be configured in a variety of ways.

Data obtained as a result of an encoding process carried out by such a convolution encoder is subjected to a maximum-likelihood decoding process for cumulating metrics of likelihood in accordance with a trellis diagram or a state-transition diagram and selecting a path with a minimum metric.

A state shown in the trellis diagram is expressed by a number representing different binary values output by shift registers serving as the delay elements 51, 52 and 53 employed in the convolution encoder shown in FIG. 1. Since such a number can have 8 ($=2^3$) different values, 8 different states can be represented by the number. In the following description, the 3 binary values are arranged in the following order: the delay element 53 followed by the delay element 52 followed by the delay element 51. For example, assume that the delay elements 53 and 52 output the binary value of 0 whereas the delay element 51 outputs the binary value of 1. In this case, the number representing 3 binary values output by the delay elements 51, 52 and 53 is "001". If input data of 0 is received by the convolution encoder shown in FIG. 1 in a state of "000", the encoder transits to the same state of "000". If input data of 1 is received by the convolution encoder in a state of "000", on the other hand, the encoder transits to a state of "001".

In FIG. 2, notations x0 to x2 each denote a point of time. At the time x0, the state is "000". At the time x1 following the time x0, the convolution encoder transits to another state of "000" or "001" due to input data of 0 or 1 respectively. By the same token, at the time x2 following the time x1, the convolution encoder transits from the other state "000" to a further state "000" or "001" due to further input data of 0 or 1 respectively, or from the other state of "001" to a further state of "010" or "011" due to further input data of 0 or 1 respectively.

On the other hand, the decoder computes a metric based on a received word or received data for each of paths through which such state transitions occur. A path with a minimum cumulated metric, that is, a path with a maximum likelihood, is selected as a probable path.

In a trellis computation carried out in a process to decode a data train completing such convolution encoding, a metric value obtained as a result of computation carried out at an immediately preceding point of time is read out from a memory such as a RAM or a register and used for computation of a metric value for the present point of time. A metric value obtained as a result of the computation carried out at the present point of time is then stored in the memory.

It should be noted that, in an embodiment described in this specification, pre-encoding input data, which should be the same as a final decoding result, is processed in 2-bit units. A processing timing is defined as a point of time at which input data is subjected to 2-bit-unit processing. Let notation t denote a processing timing corresponding to the time x0 at which input data is received. In this case, the next processing time is (t+1) corresponding to the time x2 at which first 2 bits of input data have been processed.

FIG. 3 is a diagram showing a typical configuration of a decoding circuit for the conventional convolution encoder. FIG. 4 is a diagram showing a trellis diagram used in a decoding process carried out by the decoding circuit with the configuration shown in FIG. 3.

In the decoding circuit shown in FIG. 3, an input terminal 201 receives data completing a convolution encoding process. The received data has been demodulated before being supplied to the input terminal 201. The received data is passed on to a computation unit 220. A control unit 210 includes a state-metric-memory control unit 211, a path-metric-memory control unit 212 and a trellis-computation-processing control unit 213. The state-metric-memory control unit 211 controls operations to write data into and read out data from a state-metric memory 240. On the other hand, the state-metric-memory control unit 212 controls operations to write data into and read out data from a path-metric memory 250. The trellis-computation-processing control unit 213 controls trellis computation processing carried out in the computation unit 220 and a result-outputting unit 230. A metric value obtained as a computation result output by the computation unit 220 is supplied to the state-metric memory 240 to be stored at an address in the state-metric memory 240 in a write operation controlled by a control signal generated by the state-metric-memory control unit 211 employed in the control unit 210. On the other hand, a metric value read out from an address in the state-metric memory 240 in a read operation controlled by a control signal generated by the state-metric-memory control unit 211 is supplied to the computation unit 220. Survival-path information obtained as a computation result output by the computation unit 220 is supplied to the result-outputting unit 230 in accordance with a control signal generated by the trellis-computation-processing control unit 213 employed in the control unit 210. The result-outputting unit 230 supplies a path-metric value after an operation to update information on a survival path to the path-metric memory 250 in accordance with a control signal generated by the trellis-computation-processing control unit 213. As described above, the path-metric-memory control unit 212 employed in the control unit 210 generates a control signal for controlling operations to write data into and read out data from an address in the path-metric memory 250. A path-metric value prior to an operation to update information on a survival path is read out from the path-metric memory 250 and supplied to the result-outputting unit 230. The result-outputting unit 230 outputs a final result of decoding to an output terminal 202 in accordance with a control signal generated by the trellis-computation-processing control unit 213 employed in the control unit 210.

Trellis processing computation processing operations carried out by the decoding circuit having the configuration shown in FIG. 3 are explained by referring to FIG. 4. FIG. 4 is a diagram showing data stored in the state-metric memory 240 employed in the decoding circuit shown in FIG. 3. For a constraint length of 4, there are 8 different states, namely, states S0 to S7. Metric values of states S0 to S7 are stored in the state-metric memory 240 at memory addresses MA0 to MA7 respectively. As described above, a time unit of the trellis computation processing corresponds to the period of 2 bits of pre-encoding data. That is to say, input data is subjected to the trellis computation processing with processing timings separated from each other by an interval corresponding to the period of the 2 bits.

As shown in FIG. 4, a time t corresponding to the processing timing is incremented by 1. As explained earlier with reference to FIG. 2, there are 4 different states such as S0 to S3 to which the convolution encoder can transit from a state such as S0 in a processing unit. As shown in FIG. 4, processing A is required for independently computing a metric value based on transitions from states S0, S2, S4 and S6 at a time (t−1) for state S0 at the time t. By the same token, processing B is carried out independently to compute a metric value based on transitions from states S0, S2, S4 and S6 at a time (t−1) for state S1 at the time t. In the same way, pieces of processing C to H are carried out independently of each other to compute metric values based on transitions from states S0, S2, S4 and S6 at a time (t−1) for respectively states S2 to S7 at the time t. Also in a transition from the time t to a time (t+1), the pieces of processing A to D are carried out independently of each other to compute metric values based on transitions from states S0, S2, S4 and S6 at a time t for respectively states S0, S1, S2 and S3 at the time (t+1). By the same token, in the transition from the time t to a time (t+1), the pieces of processing E to H are carried out independently of each other to compute metric values based on transitions from states S1, S3, S5 and S7 at a time t for respectively states S4, S5, S6 and S7 at the time (t+1).

By the way, in the conventional decoding circuit for decoding a signal completing a convolution encoding process as described above, as many pieces of mutually independent computation processing as states are required in the trellis computation. As described above, the number of states is determined in accordance with the constraint length. In the case of a constraint length of 4, for example, the number of states is determined to be 8. Since many pieces of such processing are required, there is raised a problem that it takes time to carry out the decoding process so that the frequency of a clock signal used in the decoding process needs to be increased.

SUMMARY OF THE INVENTION

It is thus an object of the present invention addressing the problems described above to provide a decoding apparatus and a decoding method, which are capable of shortening the decoding-process time without increasing the frequency of a clock signal used in the decoding process, as well as to provide a data-receiving apparatus and a data-receiving method, which are used for receiving the decoding data completing a convolution encoding process.

In order to solve the problems described above, in accordance with an aspect of the present invention, there are provided a decoding apparatus and a decoding method, which are characterized in that, during execution of trellis computation processing for decoding a data train completing a convolution encoding process at processing times in processing units each corresponding to processing of n bits of pre-encoding data as part of a maximum-likelihood decoding process based on a Viterbi algorithm for decoding the data train completing a convolution encoding process, processing results obtained at a processing time an immediately preceding the present processing time for $2^n$ states are processed concurrently to find processing results of the present processing time for the $2^n$ states. The processing results of the present processing time, which are found for the $2^n$ states from the parallel processing of the processing results obtained at the immediately preceding processing time for the $2^n$ states, are written back to a memory area used for storing the processing results obtained at an immediately preceding processing time for the $2^n$ states.

The above and other objects, features and advantages of the present invention will become apparent from the following description and the appended claims, taken in conjunction with the accompanying drawings in which like parts or elements denoted by like reference symbols.

DETAILED DESCRIPTION OF THE PREFERRED EMBODIMENTS

The following description explains a decoding apparatus, a decoding method, a data-receiving apparatus and a data-receiving method, which are provided by the present invention, by referring to some of the diagrams described above.

Figure 5:
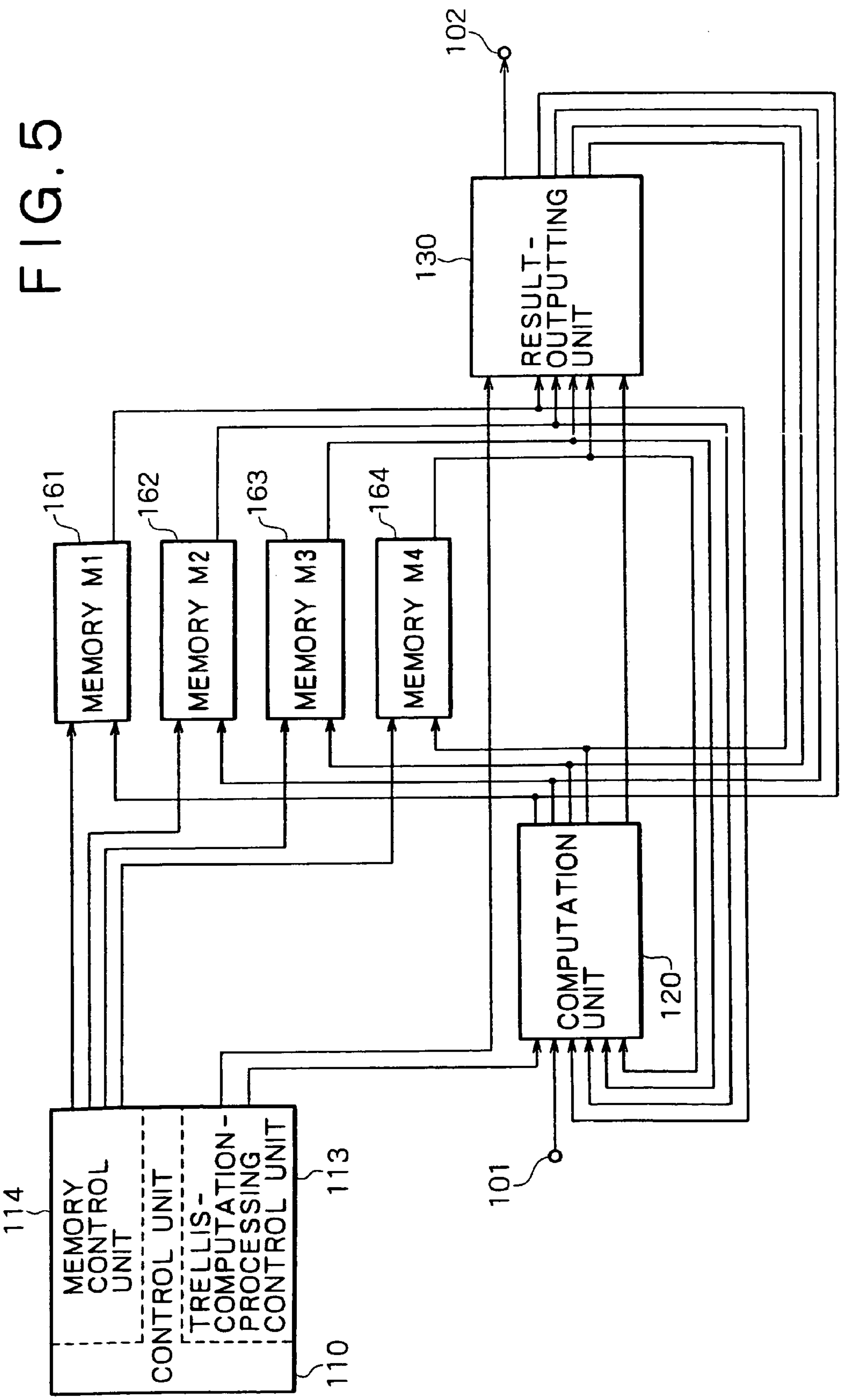
FIG. 5 is a block diagram showing the configuration of a decoding circuit implemented by an embodiment of the present invention in a simple and plain manner.

FIG. 5 is a block diagram showing the configuration of a decoding circuit implemented by an embodiment of the present invention in a simple and plain manner. In the decoding circuit shown in FIG. 5, an input terminal 101 receives data completing a convolution encoding process. The received data has been demodulated before being supplied to the input terminal 101. The received data is passed on to a computation unit 120. A control unit 110 includes a memory control unit 114 and a trellis-computation-processing control unit 113. The memory control unit 114 controls operations to write data into and read out data from memories (M1 to M4) 161 to 164. On the other hand, the trellis-computation-processing control unit 113 controls trellis computation processing carried out in the computation unit 120 and a result-outputting unit 130. A metric value obtained as a computation result output by the computation unit 120 is supplied to the memories 161 to 164 to be stored at memory addresses in the memories 161 to 164 in write operations controlled by control signals generated by the memory control unit 114 employed in the control unit 110 are supplied to the computation unit 120. On the other hand, metric values read out from addresses in the memories 161 to 164 in read operations controlled by control signals generated by the memory control unit 114 are supplied to the computation unit 120. Survival-path information obtained as a computation result output by the computation unit 120 is supplied to the result-outputting unit 130 in accordance with a control signal generated by the trellis-computation-processing control unit 113 employed in the control unit 110. The result-outputting unit 130 supplies path-metric values after an operation to update information on a survival path to the memories 161 to 164 in accordance with control signals generated by the trellis-computation-processing control unit 113 employed in the control unit 110. As described above, the memory control unit 114 employed in the control unit 110 generates control signals for controlling operations to write data into and read out data from addresses in the memories 161 to 164. Path-metric values prior to an operation to update information on a survival path are read out from the memories 161 to 164 and supplied to the result-outputting unit 130. The result-outputting unit 130 outputs a final result of decoding to an output terminal 102 in accordance with a control signal generated by the trellis-computation-processing control unit 113 employed in the control unit 110.

Figure 3:
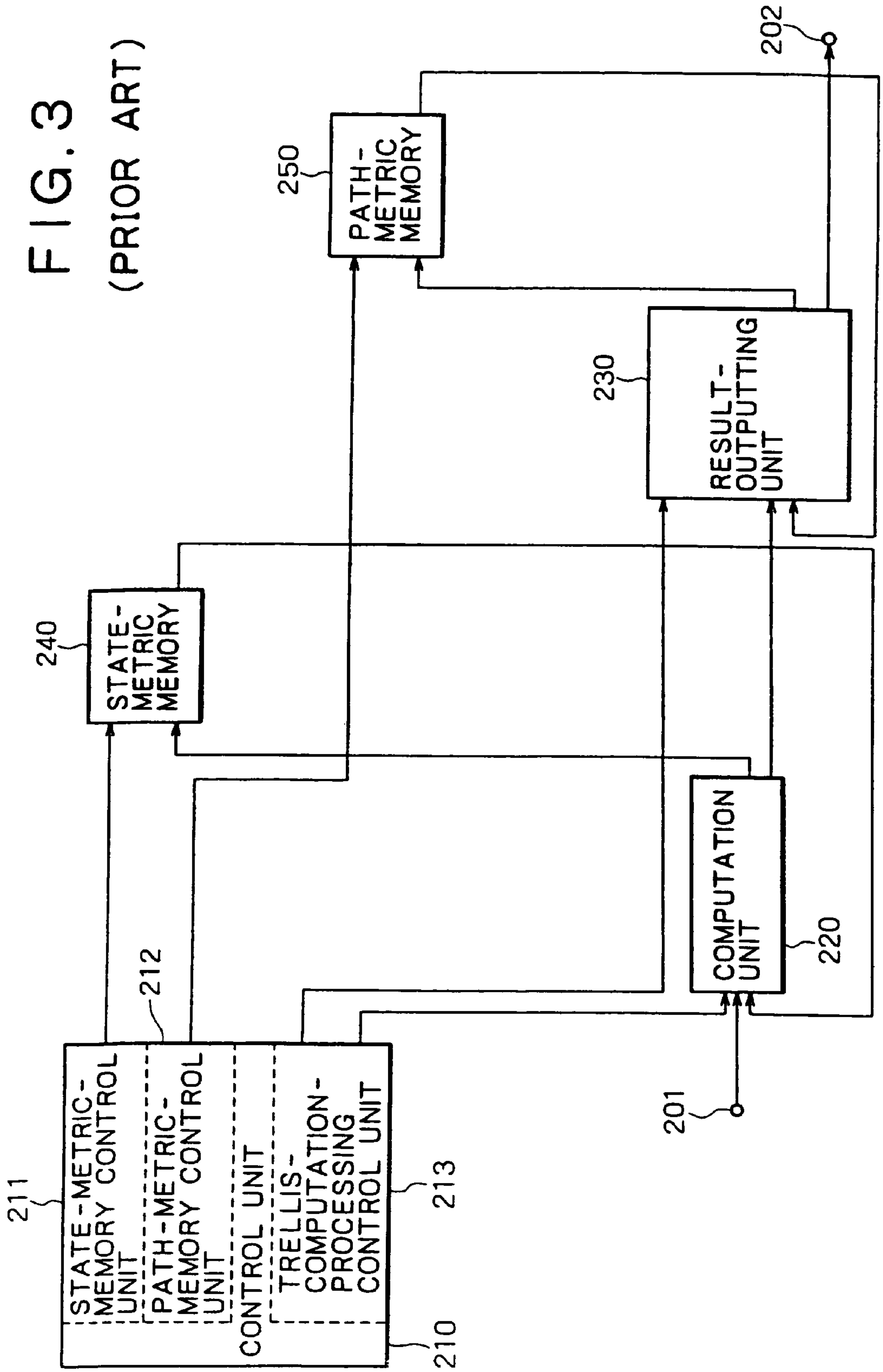
FIG. 3 is a block diagram showing a typical configuration of a decoding circuit for decoding a signal completing a convolution encoding process.

Memories M1 to M4, that is, the memories 161 to 164 respectively employed in the embodiment shown in FIG. 5, are equal to a single memory consisting of the state-metric memory 240 and the path-metric memory 250, which are employed in the conventional decoding circuit shown in FIG. 3. In the case of the embodiment shown in FIG. 5, the storage areas of the memories 161 to 164 are divided into 2 portions, which are used as areas for storing metric values and path-metric values respectively.

Figure 6:
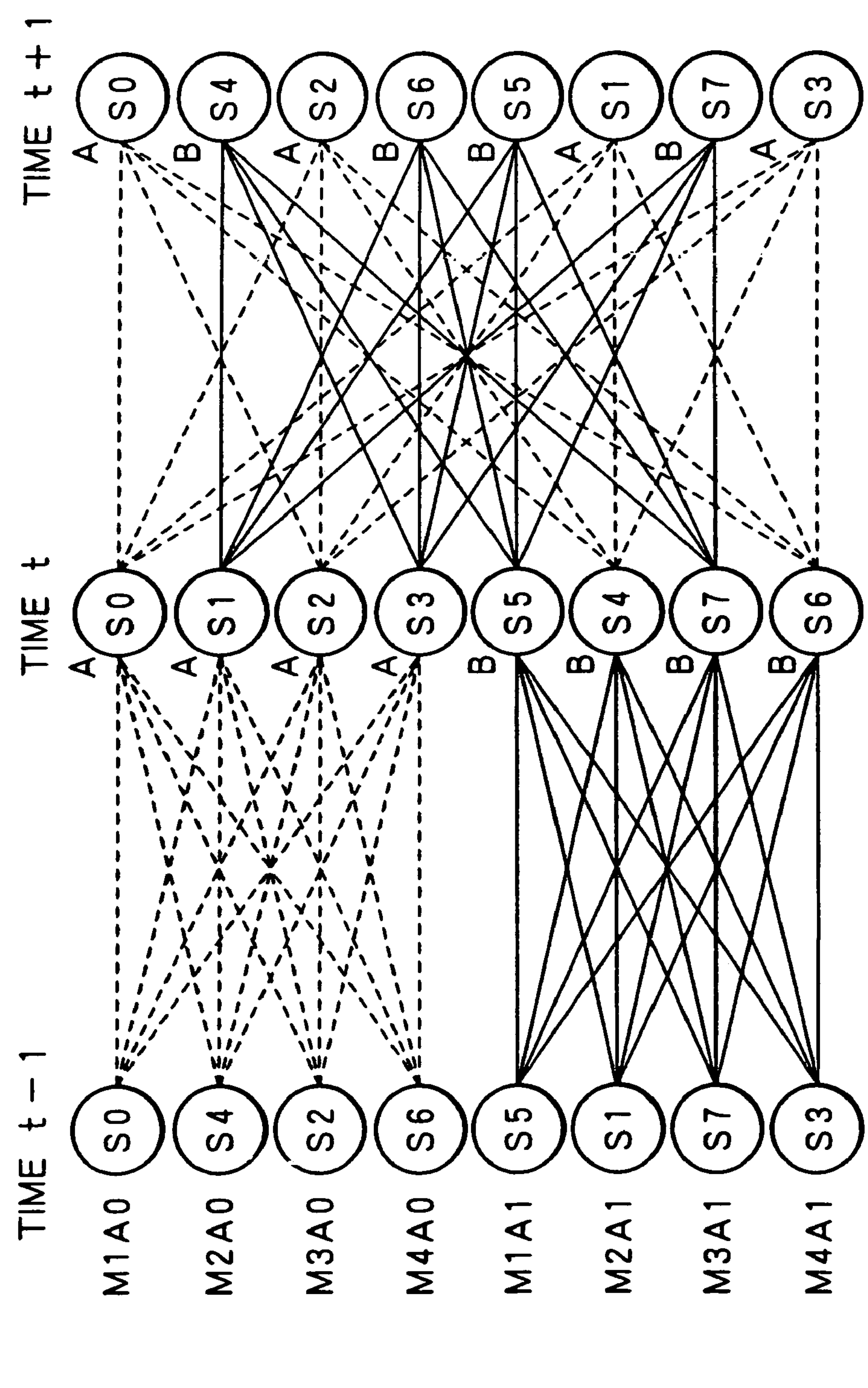
FIG. 6 is a trellis diagram used for explaining trellis computation processing operations carried out by the decoding circuit implemented by the embodiment of the present invention as shown in FIG. 5.

FIG. 6 is a trellis diagram used for explaining trellis computation processing operations carried out by the decoding circuit implemented by the embodiment of the present invention as shown in FIG. 5. States S0 to S7 shown in FIG. 6 correspond to respectively 8 states for the constraint length of 4. Metric-values for states S0 to S7 are stored at respectively addresses M1A0, M2A0, M3A0, M4A0, M1A1, M2A1, M3A1 and M4A1 in the memories M1 to M4, which are denoted by reference numerals 161 to 164 respectively. It should be noted that memory addresses M1A0 and M1A1 are addresses in the memory M1. By the same token, addresses M2A0 and M2A1 are addresses in the memory M2. In the same way, addresses M3A0 and M3A1 are addresses in the memory M3. Likewise, addresses M4A0 and M4A1 are addresses in the memory M4. In addition, 1 unit time of the trellis computation processing corresponds to a time required for processing of 2 bits of pre-encoding data. Timings delimiting unit times are each referred to as a processing timing.

In this embodiment, 2-bit processing is carried out with each processing timing. During the 2-bit processing, computation results of a processing time immediately preceding the present processing time are read out from the memories M1 to M4 denoted by reference numerals 161 to 164 respectively whereas computation results of the present processing time, which are found from the computation results of the immediately preceding processing time, are stored in the memories M1 to M4 to replace the computation results of the immediately preceding processing time. The operations to find computation results of the present processing time from the computation results of the immediately preceding processing time are carried out concurrently for 4 states. To put it in detail, in processing A, metric values are computed for states S0 to S3 from pieces of data read out from respectively the 4 addresses M1A0, M2A0, M3A0 and M4A0 assigned at the immediately preceding processing time to states S0, S4, S2 and S6 respectively, and stored at the same 4 addresses M1A0, M2A0, M3A0 and M4A0 respectively at the present processing time concurrently. Processing A is followed by processing B in the same unit time. In processing B, on the other hand, metric values are computed for states S4 to S7 from pieces of data read out from respectively the 4 addresses M1A1, M2A1, M3A1 and M4A1 assigned at the immediately preceding processing time to states S5, S1, S7 and S3 respectively, and stored at the same 4 addresses M1A1, M2A1, M3A1 and M4A1 respectively at the present processing time concurrently. Thus, during a unit time, metric values for the present processing time can be computed for all the 8 states. It should be noted that, for a unit time or a period between 2 consecutive processing timings corresponding to n-bit processing, parallel processing is carried out to compute metric values for 2n states. For a unit time corresponding to 2-bit processing, that is, for n=2, for example, parallel processing is carried out to compute metric values for 4 (=2×2) states. The 2-bit processing is carried out twice in a unit time to compute metric values for 8 states.

Figure 4:
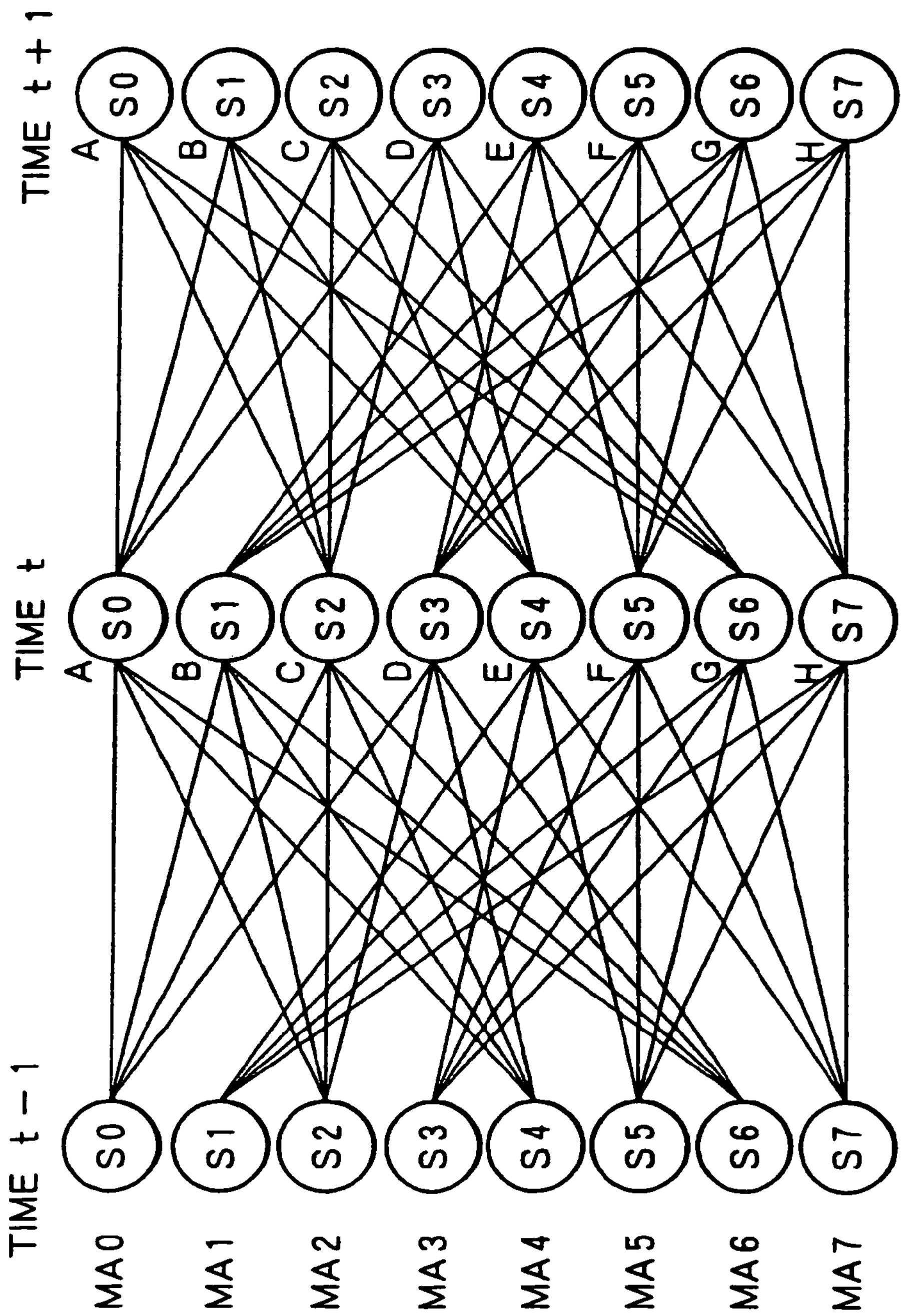
FIG. 4 is a trellis diagram used for explaining trellis computation processing operations carried out for decoding a signal completing a convolution encoding process.
Figure 7:
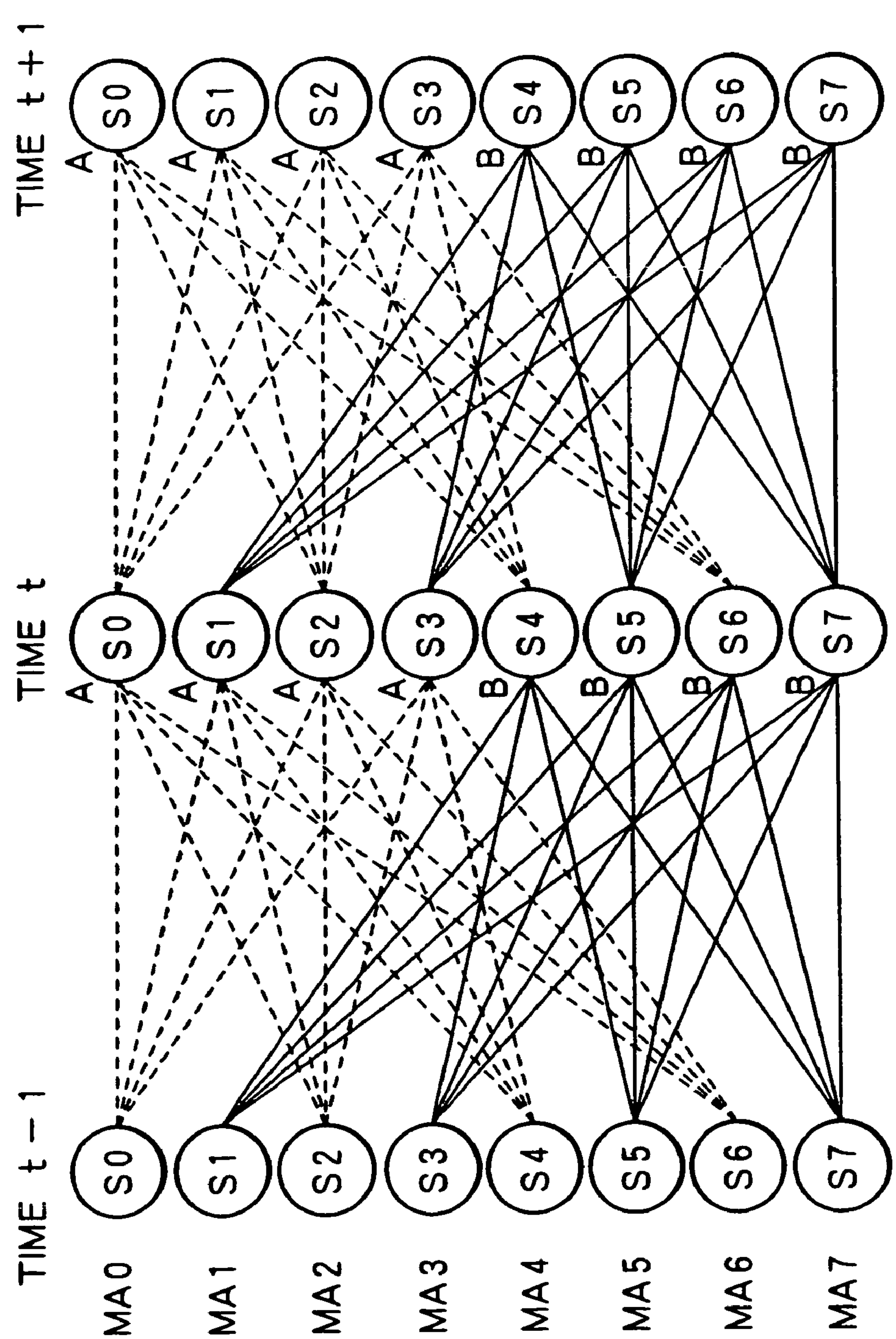
FIG. 7 is a trellis diagram used for explaining operations for a case in which metric values for 4 states are computed in a simple way at the same time.

The above trellis computation is compared with the conventional trellis computation explained earlier by referring to FIG. 4. FIG. 7 is a trellis diagram used for explaining operations for a case in which metric values for 4 states in a transition from a time (t−1) to a time t are computed in a simple way at the same time. Much like the trellis computation shown in FIG. 6, 2 pieces of processing, namely, processing A and next processing B, are carried out in 1 unit time or with 1 processing timing. To put it in detail, in processing A denoted by dashed lines, metric values are computed for states S0 to S3 from pieces of data read out from respectively the 4 addresses MA0, MA2, MA4 and MA6 assigned at the immediately preceding processing time to states S0, S2, S4 and S6 respectively, and stored at the 4 addresses MA0, MA1, MA3 and MA4 respectively at the present processing time concurrently. In processing B denoted by solid lines, on the other hand, metric values are computed for states S4 to S7 from pieces of data read out from respectively the 4 addresses MA1, MA3, MA5 and MA7 assigned at the immediately preceding processing time to states S1, S3, S5 and S7 respectively, and stored at the 4 addresses MA4, MA5, MA6 and MA7 respectively at the present processing time simultaneously. Much like the conventional trellis computation shown in FIG. 4, however, metric values are read out from addresses MA0 to MA7 in a single state-metric memory M, which is denoted by reference numeral 240 in FIG. 3. Thus, there is raised a problem that, in processing B, pieces data read out from the addresses MA1 and MA3 are not metric values of the immediately preceding processing time, but results of trellis computation, which were obtained in preceding processing A. That is to say, with a single state-metric memory M, 8 pieces of processing, namely, processing A to processing H shown in FIG. 4, are required. In other words, they cannot be reduced to 2 pieces of processing like the trellis computation shown in FIG. 6.

In order to solve this problem, this embodiment employs 4 memories M1 to M4 in place of the single state-metric memory M, and dynamically assigns 2 addresses in each of the 4 memories M1 to M4 to each one of states S0 to S7. In this way, it is possible to prevent an operation to write a result of computation over a metric value, which has not been processed yet. As shown in FIG. 6, in the trellis computation implemented by the embodiment, present metric values obtained as a result of concurrent trellis computation processing carried out on immediately preceding metric values are stored only at memory addresses used for storing the immediately preceding metric values, which have been subjected to the concurrent trellis computation processing.

Generally speaking, for a constraint length of m, that is, for a state count of $2^{(m-1)}$, present metric values are computed from immediately preceding metric values stored at memory addresses under the following conditions:

1: 4 addresses, at which results of trellis computation parallel processing for 4 states from immediately preceding metric values of the four states are stored as present metric values, are the same addresses at which the immediately preceding metric values are stored.

2: The trellis computation parallel processing is carried out repeatedly as many times as $\{2^{(m-1)}\}$ states/4 to compute present metric values for all the states.

3: Conditions 1 and 2 are satisfied, that is, present metric values are never written over immediately preceding metric values, which have not been processed yet, during the decoding process, from a start time of 0 till the end of the decoding process.

Concrete operations are explained by referring to FIG. 6 as follows. In the following description, the memories 161 to 164 are denoted by notations M1 to M4 respectively. 2 addresses in each of the memories M1 to M4 are used. To put it concretely, addresses M1A0 and M1A1 are addresses in the memory M1. By the same token, addresses M2A0 and M2A1 are addresses in the memory M2. In the same way, addresses M3A0 and M3A1 are addresses in the memory M3. Likewise, addresses M4A0 and M4A1 are addresses in the memory M4.

First of all, a transition from a time (t−1) to a time t is explained. In this transition, parallel processing A is carried out to process pieces of data stored at memory addresses M1A0, M2A0, M3A0 and M4A0. Then, parallel processing B is carried out to process pieces of data stored at memory addresses M1A1, M2A1, M3A1 and M4A1. The order in which parallel processing A and parallel processing B are carried out can be reversed.

At a time (t−1), metric values for states S0, S2, S4 and S6 are stored at memory addresses M1A0, M2A0, M3A0 and M4A0 respectively. On the other hand, metric values for states S1, S3, S5 and S7 are stored at memory addresses M1A1, M2A1, M3A1 and M4A1 respectively.

In parallel processing A, the metric values for states S0, S4, S2 and S6 stored at the memory addresses M1A0, M2A0, M3A0 and M4A0 respectively at the time (t−1) are read out to be used in computation of metric values at the time t for 2 pre-encoding data bits of "00", "01", "10" and "11". By the way, state S0 at the time (t−1) transits to state S0, S1, S2 or S3 for 2 pre-encoding data bits of "00", "01", "10" or "11" respectively. By the same token, all other states S2, S4 and S6 at the time (t−1) transit to state S0, S1, S2 or S3 for 2 pre-encoding data bits of "00", "01", "10" or "11" respectively. Thus, the metric values for states S0, S4, S2 and S6 stored at the memory addresses M1A0, M2A0, M3A0 and M4A0 respectively at the time (t−1) are read out to be used in computation of metric values at the time t for states S0, S1, S2 and S3. The metric values at the time t for states S0, S1, S2 and S3, that is, results of computation for states S0, S1, S2 and S3, are then stored at the same memory addresses M1A0, M2A0, M3A0 and M4A0 respectively.

In next parallel processing B, on the other hand, the metric values for states S5, S1, S7 and S3 stored at the memory addresses M1A1, M2A1, M3A1 and M4A1 respectively at the time (t−1) are read out to be used in computation of metric values at the time t for 2 pre-encoding data bits of "00", "01", "10" and "11". That is to say, the metric values for states S5, S1, S7 and S3 stored at the memory addresses M1A1, M2A1, M3A1 and M4A1 respectively at the time (t−1) are used in computation of and results of the computation are to be stored at the same memory addresses M1A1, M2A1, M3A1 and M4A1 as metric values at the time t for states S4, S5, S6 and S7 respectively. In actuality, however, the order of storing the metric values of the states S4, S5, S6 and S7 is deliberately changed so that the metric values at the time t for states S5, S4, S7 and S6 are stored at the same memory addresses M1A1, M2A1, M3A1 and M4A1 respectively. As a result, the number of changes in relations associating the memory addresses with the states can be reduced considerably as shown in FIG. 6. That is to say, the number of transpositions of states and memory addresses can be decreased substantially. To put it in detail, by storing the metric values at the time t for states S5, S4, S7 and S6 at the same memory addresses M1A1, M2A1, M3A1 and M4A1 respectively, the relation between the memory address M1A1 and the metric value for state S5 as well as the relation between the memory address M3A1 and the metric value for state S7 can be fixed, that is, are not changed.

Then, a transition from the time t to a time (t+1) is explained. In this transition, parallel processing A is carried out on pieces of data stored at memory addresses M1A0, M3A0, M2A1 and M4A1 to compute metric states for states S0, S2, S4 and S6. Then, parallel processing B is carried out to process pieces of data stored at memory addresses M2A0, M4A0, M1A1 and M3A1 to compute metric states for states S1, S3, S5 and S7. The order in which parallel processing A and parallel processing B are carried out can be reversed.

In parallel processing A, the metric values for states S0, S2, S4 and S6 stored at the memory addresses M1A0, M3A0, M2A1 and M4A1 respectively at the time t are read out to be used in computation of metric values at the time (t+1) for 2 pre-encoding data bits of "00", "01", "10" and "11". Thus, the metric values for states S0, S2, S4 and S6 stored at the memory addresses M1A0, M3A0, M2A1 and M4A1 respectively at the time t are used in computation of metric values at the time (t+1) for states S0, S1, S2 and S3. The metric values at the time (t+1) for states S0, S2, S1 and S3, that is, results of computation for states S0, S1, S2 and S3, are then stored at the same memory addresses M1A1, M3A0, M2A1 and M4A1 respectively.

In next parallel processing B, on the other hand, the metric values for states S1, S3, S5 and S7 stored at the memory addresses M2A0, M4A0, M1A1 and M3A1 respectively at the time t are read out to be used in computation of metric values at the time (t+1) for 2 pre-encoding data bits of "00", "01", "10" and "11". That is to say, the metric values for states S1, S3, S5 and S7 stored at the memory addresses M2A0, M4A0, M1A1 and M3A1 respectively at the time t are used in computation of and results of the computation are to be stored at the same memory addresses M2A0, M4A0, M1A1 and M3A1 as metric values at the time (t+1) for states S4, S6, S5 and S7 respectively.

Since the relations between the memory addresses and the states at the time (t−1) are the same as the relations between the memory addresses and the states at the time (t+1), pieces of processing in a transition from the (t+1) to a time (t+2) can be carried out in the same way as the pieces of processing in the transition from the (t−1) to the time t to result in the same relations between the memory addresses and the states at the time (t+2) as the relations between the memory addresses and the states at the time t. For this reason, the same pieces of processing as the pieces of processing in the transition from the (t−1) to the time t are carried out thereafter alternately with the same pieces of processing as the pieces of processing in the transition from the t to the time (t+1).

It should be noted that relations between the memory addresses and the states are not limited to those adopted in the embodiment. In addition, the constraint length does not have to be 4. The present invention can also be applied to constraint lengths of 5 and greater. For a constraint length of 9, for example, the number of states is $2^8=256$. In this case, 4-state parallel processing is repeated consecutively 64 times to process metric values for all the states in 1 unit time. The 64 consecutive pieces of 4-state parallel processing, which are carried out in 1 unit time, are repeated every other 3 unit times to give a period of 4 unit times.

Figure 8:
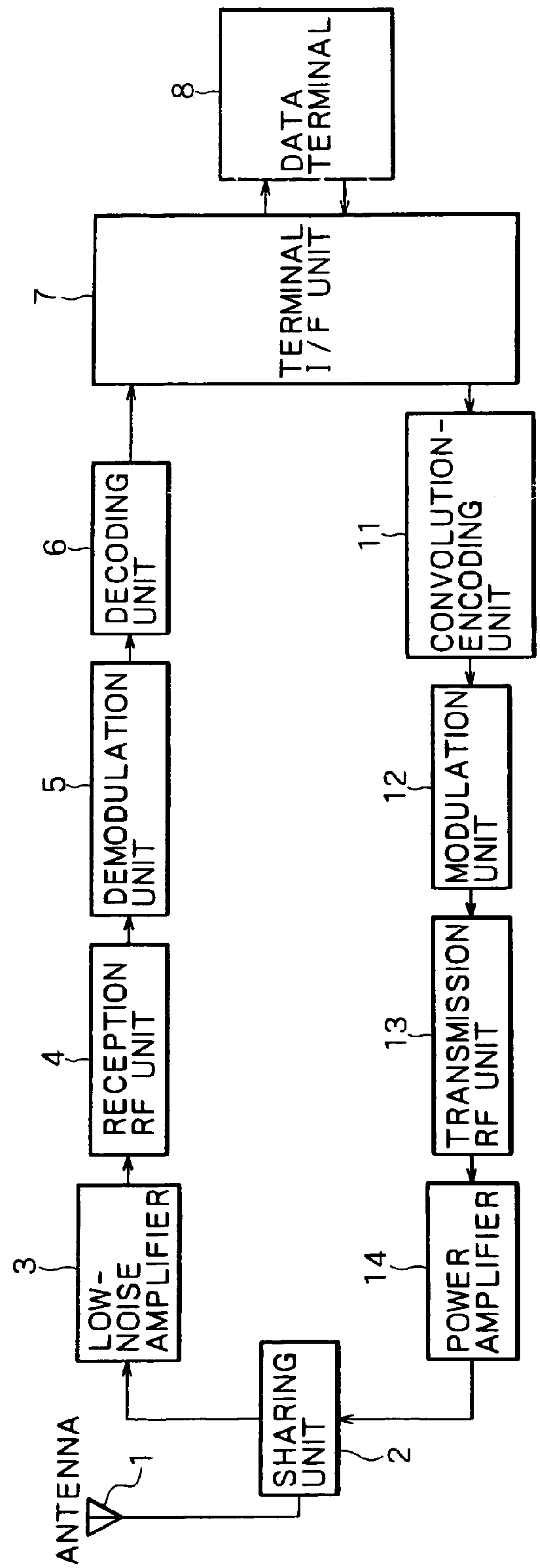
FIG. 8 is a block diagram showing the configuration of a data-transmitting and receiving apparatus implemented by an embodiment of the present invention in a simple and plain manner.

FIG. 8 is a block diagram showing the configuration of a data-transmitting and receiving apparatus employing the convolution-encoded-signal-decoding circuit shown in FIG. 5.

In the data transmitting and receiving apparatus shown in FIG. 8, a signal received by an antenna 1 is supplied to a low-noise amplifier 3 for amplifying the signal. The signal is supplied to the low-noise amplifier 3 by way of a sharing unit 2 for allowing the antenna 1 to be used for both reception and transmission of signals. The amplified signal is supplied to a reception RF (Radio Frequency) unit 4 for transforming the amplified signal into a signal of a base band. The base-band signal is supplied to a demodulation unit 5 for carrying out base-band-signal processing to demodulate the base-band signal. A signal obtained as a result of the demodulation is supplied to a decoding unit 6 for decoding the signal. The decoding unit 6 has a decoding circuit for decoding a signal completing a convolution-encoding process. The decoding circuit is shown in FIG. 5. A signal obtained as a result of the decoding is supplied to a terminal interface (I/F) unit 7 as packet data. The terminal I/F unit 7 passes on the packet data to a data terminal 8.

Figure 1:
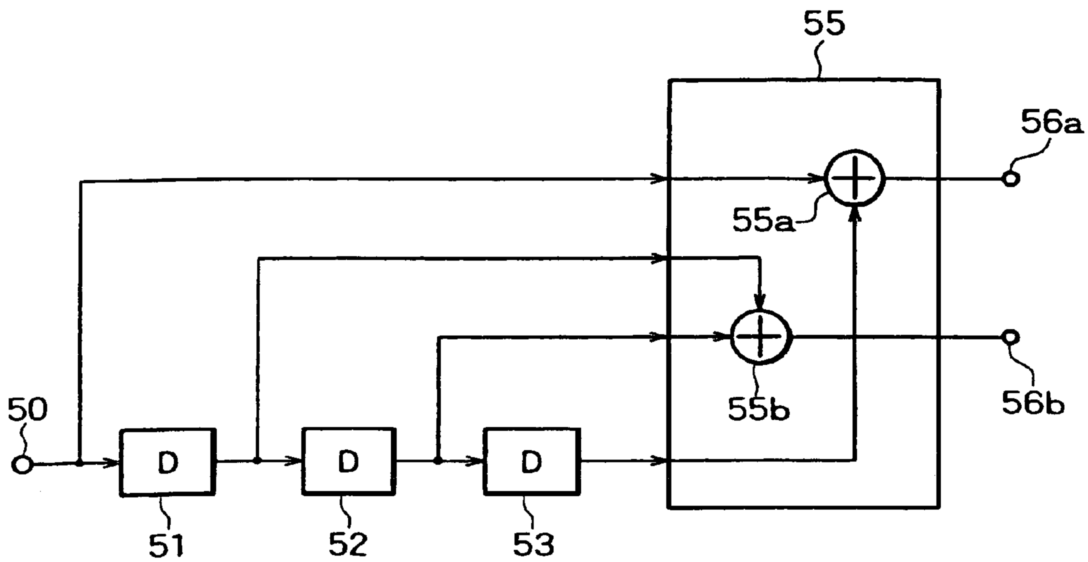
FIG. 1 is a block diagram showing the configuration of a convolution encoder with a constraint length of 4 in a simple and plain manner.
Figure 2:
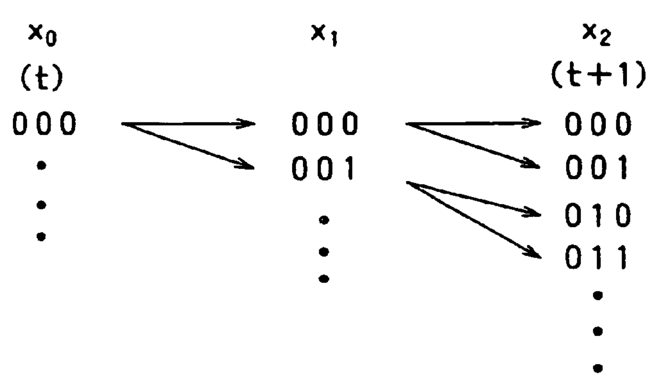
FIG. 2 is an explanatory diagram used for describing state transitions of the convolution encoder shown in FIG. 1.

On the other hand, the data terminal 8 receives data to be transmitted and supplies the data to a convolution-encoding unit 11 by way of the terminal I/F unit 7. The convolution-encoding unit 11 carries out convolution encoding explained earlier by referring to FIG. 1. Data completing the convolution-encoding process is supplied to a modulation unit 12 for modulating the data. The modulated data converted into a signal in the RF band by a transmission RF unit 13. A signal output by the transmission RF unit 13 is amplified by a power amplifier 14 before being output to the antenna 1 by way of the sharing unit 2.

It should be noted that FIG. 8 shows the configuration of the data-transmitting and receiving apparatus only in a simple and plain manner. An actual configuration of the data-transmitting and receiving apparatus includes components for spread spectrum communication, components for establishing synchronization, components for interleaving and components for error correction. Being irrelevant to essentials of the present invention, nevertheless, explanation of these components is omitted.

The data-transmitting and receiving apparatus with a configuration like the one shown in FIG. 8 is capable of shortening the time of a decoding process carried out by the decoding unit 6 without raising the frequency of the processing clock signal and, hence, capable of carrying out a decoding process at a high speed. As a result, the processing to receive data can be generally carried out at a high speed as well.

It should be noted that the scope of the present invention is not limited to the embodiment. For example, while the embodiment implements a process to decode data encoded by a convolution encoder with a constraint length of 4 to give 8 states, the present invention can also be applied to a process to decode data encoded by a convolution encoder with a constraint length other than 4. In addition, the decoding process unit does not have to be 2 bits of pre-encoding data. In the case of a decoding process with a decoding process unit of 3 bits, for example, processing is carried out concurrently on data for 8 states. Moreover, the configuration of the decoding circuit is not limited to the typical one shown in FIG. 5. It is needless to say that a variety of changes and modifications can be made to the configuration as long as the changes and the modifications do not depart from the true spirit of the present invention.

In accordance with the decoding apparatus and the decoding method, which are provided by the present invention, in a maximum-likelihood decoding process based on a Viterbi algorithm for decoding a data train completing a convolution-encoding process, trellis computation for decoding the data train completing a convolution-encoding process is carried out repeatedly with processing timings in processing units each corresponding to processing carried out on n bits of pre-encoding data, in which the trellis computation for each of the processing units is parallel processing carried out on computation results obtained with a processing timing immediately preceding the present processing timing for $2^n$ states to find computation results with the present processing timing for the $2^n$ states so as to shorten the processing time without the need to raise the frequency of a clock signal used in the processing.

In the parallel processing carried out on computation results obtained at an immediately preceding processing time for $2^n$ states, the computation results are read out from a memory area and the computation results found at the present processing time for the $2^n$ states are stored in the same memory area. Thus, the computation results found at the present processing time for the $2^n$ states can be prevented from being written over unprocessed computation results. In addition, since there is no need to provide a memory area for storing new computation results separately from a memory area for storing computation results obtained at an immediately preceding processing time, an increase in memory capacity can be avoided. In other words, it is necessary to merely provide a memory with a small storage capacity in comparison with a decoding apparatus employing a pair of memories, namely, a memory for storing new computation results and a memory from which computation results obtained at an immediately preceding processing time are to be read out.

Moreover, in accordance with the decoding apparatus and the decoding method, which are provided by the present invention, in a maximum-likelihood decoding process based on a Viterbi algorithm for decoding a data train completing a convolution-encoding process, trellis computation for decoding the data train completing a convolution-encoding process is carried out repeatedly with processing timings in processing units each corresponding to processing carried out on n bits of pre-encoding data, in which the trellis computation for each of the processing units is parallel processing carried out on computation results obtained with a processing timing immediately preceding the present processing timing for $2^n$ states to find computation results with the present processing timing for the $2^n$ states as described above. It is thus possible to provide a data-receiving apparatus having a decoding unit capable of decoding data in a shortened period of time and to provide a data-receiving method adopted by the data-receiving apparatus.

While a preferred embodiment of the present invention has been described using specific terms, such description is for illustrative purposes only, and it is to be understood that changes and variations may be made without departing from the spirit or scope of the following claims.

What is claimed is:

1. A decoding apparatus for performing a maximum-likelihood decoding process based on a Viterbi algorithm on a data train completing a convolution-encoding process, said decoding apparatus comprising:

computation means for performing a trellis computation for decoding said data train completing said convolution-encoding process;

control means for controlling said trellis computation to be performed by said computation means with a plurality of processing timings in a plurality of processing units each corresponding to a process performed on n bits of pre-encoding data, wherein each of said plurality of processing units performs parallel processing performed on a plurality of computation results obtained for $2^n$ states with one of said plurality of processing timings immediately preceding a present timing of said plurality of processing timings to obtain computation results for said $2^n$ states; and memory means for storing said computation results obtained with said immediately preceding processing timing and said present processing timing, wherein during each of said processing units said computation results obtained for said $2^n$ states with said immediately preceding processing timing are read from a storage area of said memory means and said computation results found with said present processing timing for said $2^n$ states are stored in said storage area, wherein said computation results include metric values and path-metric values and said storage area is divided into two portions used as areas for storing the metric values and the path-metric values, respectively.

2. A decoding method for performing a maximum-likelihood decoding process based on a Viterbi algorithm on a data train completing a convolution-encoding process, comprising the step of performing a trellis computation for decoding said data train completing said convolution-encoding process with a plurality of processing timings in a plurality of processing units each corresponding to a process carried out on n bits of pre-encoding data, wherein each of said processing units is parallel performs processing performed on a plurality of computation results obtained for $2^n$ states with one of said plurality of processing timings immediately preceding a present one of said processing timings to find computation results for said $2^n$ states; and in each of said plurality of processing units each of said plurality of computation results obtained for said $2^n$ states with said immediately preceding processing timing are read from a storage area of a memory, and said computation results obtained with said present processing timing for said $2^n$ states are stored in said storage area, wherein said computation results include metric values and path-metric values and said storage area is divided into two portions used as areas for storing the metric values and the path-metric values, respectively.

* * * * *

UNITED STATES PATENT AND TRADEMARK OFFICE

CERTIFICATE OF CORRECTION

PATENT NO. : 7,003,717 B2
APPLICATION NO. : 11/077064
DATED : February 21, 2006
INVENTOR(S) : Yasuyoshi Kuwazoe and Taku Nagase It is certified that error appears in the above-identified patent and that said Letters Patent is hereby corrected as shown below:

On the title page notice [*] please insert --This patent is subject to a Terminal Disclaimer.--

Signed and Sealed this

Twelfth Day of February, 2008

JON W. DUDAS

*Director of the United States Patent and Trademark Office*